(12) United States Patent
Novellini

(10) Patent No.: US 11,705,910 B1
(45) Date of Patent: Jul. 18, 2023

(54) FAST LINE RATE SWITCHING IN PERIPHERAL COMPONENT INTERCONNECT EXPRESS (PCIE) ANALYZERS

(71) Applicant: XILINX, INC., San Jose, CA (US)

(72) Inventor: Paolo Novellini, Gorgonzola (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/569,395

(22) Filed: Jan. 5, 2022

(51) Int. Cl.
| | |
|---|---|
| *H03L 7/081* | (2006.01) |
| *G06F 13/42* | (2006.01) |
| *H03K 19/21* | (2006.01) |
| *H03L 7/08* | (2006.01) |

(52) U.S. Cl.
CPC .......... *H03L 7/0812* (2013.01); *G06F 13/423* (2013.01); *H03K 19/21* (2013.01); *H03L 7/0807* (2013.01)

(58) Field of Classification Search
CPC ... H03L 7/0812; H03L 7/0807; G06F 13/423; H03K 19/21
See application file for complete search history.

(56) References Cited

U.S. PATENT DOCUMENTS

| | | | | |
|---|---|---|---|---|
| 6,310,521 | B1 * | 10/2001 | Dalmia | H03L 7/087 331/25 |
| 6,683,930 | B1 * | 1/2004 | Dalmia | H03D 13/004 375/376 |
| 7,315,596 | B2 * | 1/2008 | Payne | H04L 7/0337 375/355 |
| 7,650,525 | B1 * | 1/2010 | Chang | H04L 25/14 375/354 |
| 7,917,797 | B2 | 3/2011 | Novellini et al. | |
| 8,666,010 | B1 | 3/2014 | Novellini | |
| 8,681,919 | B1 | 3/2014 | Novellini | |
| 8,724,764 | B2 | 5/2014 | Guasti et al. | |

(Continued)

FOREIGN PATENT DOCUMENTS

| | | | |
|---|---|---|---|
| CN | 216209620 U | * | 4/2022 |
| CN | 115221070 A | * | 10/2022 |
| KR | 20210141813 A | * | 11/2021 |

OTHER PUBLICATIONS

Texas Instruments, "DS160PR412 PCIe®4.0 16 Gbps 4-channel Linear Redriver with Integrated 1:2 Demux," Dec. 2020, 37 pages.

(Continued)

*Primary Examiner* — Adam D Houston
(74) *Attorney, Agent, or Firm* — Patterson + Sheridan, LLP

(57) ABSTRACT

Methods and apparatus for quickly changing line rates in PCIe analyzers without resetting the receivers. One example circuit for multi-rate reception generally includes: a receiver having a data input, a data output, and a clock input configured to receive a clock signal from a clock generator, the receiver being configured to switch between receiving data at a first data rate and at least one second data rate and to sample data according to the first data rate, wherein the first data rate is higher than the at least one second data rate; a phase detector having an input coupled to the data output of the receiver; and a filter having an input coupled to an output of the phase detector and having an output configured to effectively control a phase of the sampling by the receiver when the data is at the at least one second data rate.

20 Claims, 6 Drawing Sheets

(56) References Cited

U.S. PATENT DOCUMENTS

| | | | |
|---|---|---|---|
| 8,831,140 B2 * | 9/2014 | Chan | G06F 13/385 |
| | | | 375/316 |
| 8,958,513 B1 | 2/2015 | Novellini et al. | |
| 8,971,468 B1 | 3/2015 | Novellini | |
| 9,130,807 B1 | 9/2015 | Novellini | |
| 9,143,316 B1 | 9/2015 | Novellini | |
| 9,331,724 B2 | 5/2016 | Novellini et al. | |
| 9,378,174 B2 | 6/2016 | Novellini et al. | |
| 9,479,181 B1 * | 10/2016 | Ding | H03L 7/1974 |
| 9,992,049 B1 | 6/2018 | Novellini | |
| 10,291,501 B1 | 5/2019 | Novellini et al. | |
| 10,348,312 B1 | 7/2019 | Novellini et al. | |
| 10,419,203 B1 | 9/2019 | Novellini et al. | |
| 10,547,317 B1 | 1/2020 | Novellini et al. | |
| 10,832,757 B1 | 11/2020 | Novellini et al. | |
| 2009/0289667 A1 | 11/2009 | Novellini et al. | |
| 2013/0321047 A1 | 12/2013 | Guasti et al. | |
| 2014/0037033 A1 * | 2/2014 | Hoang | H03L 7/183 |
| | | | 375/355 |
| 2015/0127877 A1 | 5/2015 | Novellini et al. | |
| 2016/0080008 A1 | 3/2016 | Novellini et al. | |
| 2016/0380638 A1 * | 12/2016 | Kumazawa | H03L 7/0814 |
| | | | 375/354 |
| 2018/0183633 A1 * | 6/2018 | Ho | H04L 7/033 |
| 2020/0382269 A1 * | 12/2020 | Lee | H03L 7/0807 |
| 2021/0111859 A1 * | 4/2021 | Gaade | H03L 7/0998 |
| 2021/0359688 A1 * | 11/2021 | Pyun | G09G 5/008 |

OTHER PUBLICATIONS

Novellini, P, et al., "Clock and Data Recovery Unit based on Deserialized Oversampled Data," Application Note: 7 Series and UltraScale Devices, XAPP1240 (v3.0), Sep. 14, 2020, 26 pages.

* cited by examiner

FAST LINE RATE SWITCHING IN PERIPHERAL COMPONENT INTERCONNECT EXPRESS (PCIE) ANALYZERS

TECHNICAL FIELD

Examples of the present disclosure generally relate to receivers for Peripheral Component Interconnect Express (PCIe) analyzers, and more particularly, to quickly switching receiver line rates in PCIe analyzers.

BACKGROUND

PCIe interfaces may be tested by analyzers. Such testing may be useful for designers of devices using PCIe interfaces to debug connections made by the PCIe interface. A PCIe analyzer may probe the data flowing between a root complex and an endpoint of a PCIe link. A typical PCIe analyzer has receivers for probing the data flowing in a PCIe link and no transmitters.

An important performance criterion for a PCIe analyzer is how quickly the PCIe analyzer can switch line rates in the receivers of the PCIe analyzer. If a PCIe analyzer is being used to probe the data in a PCIe link of a device under test (DUT) and the DUT changes its receive line rate faster than the PCIe analyzer changes its receive line rate, then the PCIe analyzer may not be able to observe what occurs on the link during the line rate change. Observing the link during a line rate change is among the more important functions of a PCIe analyzer, as many problems can occur during a line rate change, and it is desirable for a designer debugging the DUT to be able to gather data regarding line rate changes by the DUT.

Therefore, it is desirable to develop circuits and techniques enabling a PCIe analyzer to change receive line rates in very short periods (e.g., less than 10 nanoseconds).

SUMMARY

Examples described herein generally relate to circuits for multi-rate reception and methods that change a receiver line rate in a PCIe analyzer very quickly (e.g., in one clock cycle of the receiver, such as in a period as short as a few nanoseconds).

In one example, a circuit for multi-rate reception is provided. The circuit generally includes a receiver having a data input, a data output, and a clock input configured to receive a clock signal from a clock generator, the receiver being configured to switch between receiving data at a first data rate and at least one second data rate and to sample data according to the first data rate, wherein the first data rate is higher than the at least one second data rate; a phase detector having an input coupled to the data output of the receiver; and a filter having an input coupled to an output of the phase detector and having an output configured to effectively control a phase of the sampling by the receiver when the data is at the at least one second data rate.

In another example, a programmable integrated circuit (IC) is provided that includes a plurality of configurable logic blocks. The plurality of configurable logic blocks is generally configured to implement: a receiver having a data input, a data output, and a clock input configured to receive a clock signal from a clock generator, the receiver being configured to switch between receiving data at a first data rate and at least one second data rate and to sample data at the first data rate, wherein the first data rate is higher than the at least one second data rate; a phase detector having an input coupled to the data output of the receiver; and a filter having an input coupled to an output of the phase detector and having an output configured to effectively control a phase of the sampling by the receiver when the data is at the at least one second data rate.

In yet another example, a Peripheral Component Interconnect Express (PCIe) analyzer is provided. The PCIe analyzer includes a circuit for multi-rate reception that includes a receiver having a data input, a data output, and a clock input configured to receive a clock signal from a clock generator, the receiver being configured to switch between receiving data at a first data rate and at least one second data rate and to sample data according to the first data rate, wherein the first data rate is higher than the at least one second data rate; a phase detector having an input coupled to the data output of the receiver; and a filter having an input coupled to an output of the phase detector and having an output configured to effectively control a phase of the sampling by the receiver when the data is at the at least one second data rate. The PCIe analyzer further includes the clock generator, wherein the clock generator has an input coupled to the clock input of the receiver.

In yet another example, a method of multi-rate reception is provided. The method generally includes receiving data at a first data rate on a data input of a receiver; switching to receiving the data at a second data rate on the data input of the receiver; receiving a clock signal on a clock input of the receiver; sampling, with the receiver, the data at the second data rate according to the first data rate, based on the clock signal; and effectively controlling a phase of the sampling when the data is received at the second rate.

In yet another example, an apparatus is provided. The apparatus generally includes means for receiving data at a first data rate; means for switching to receiving the data at a second data rate; means for receiving a clock signal; means for sampling the data at the second data rate according to the first data rate, based on the clock signal; and means for effectively controlling a phase of the sampling when the data is received at the second rate.

These and other aspects may be understood with reference to the following detailed description.

BRIEF DESCRIPTION OF THE DRAWINGS

So that the manner in which the above-recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
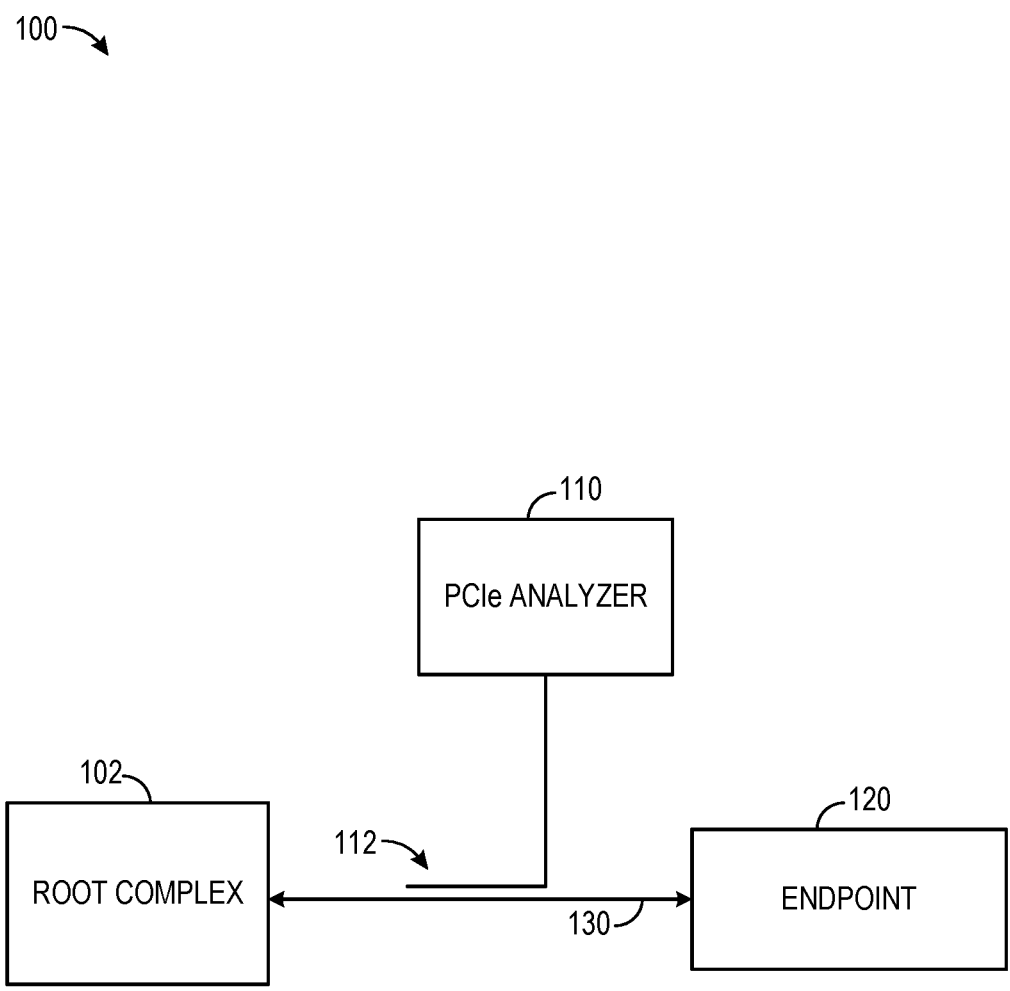
FIG. 1 shows a block diagram of a test system in which examples of the present disclosure may be practiced.

Examples of the present disclosure provide methods and apparatus for quickly changing receive line rates in a receiver (e.g., of a Peripheral Component Interconnect Express (PCIe) analyzer), without resetting the receiver. For example, a receiver may be able to change from receiving data at a line rate of 32 gigabits per second (Gbps) to receiving data at a line rate of 16 Gbps by continuing to sample the data with the same sampling clock signal frequency used for 32 Gbps line rates, but effectively controlling phase adjustment of the sampling clock signal (as well as internal clock and data recovery (CDR) of the receiver) to phase align the sampling clock signal with the received data samples. This effective control of the phase for the sampling clock signal may be accomplished, for example, by implementing a phase-locked loop: (1) to control a reference clock generator with a phase shift control input, the reference clock generator being external to the receiver, or (2) to control a phase interpolator internal to the receiver.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

In the description that follows, the phrase "receive line rate" (also referred to as a "data rate") refers to the rate of data being received, via a lane of a PCIe interface, at an endpoint from a root complex of a PCIe bus, or vice versa. A PCIe bus is a serial computer bus that may have 1 to 32 lanes. Each lane of a PCIe bus is composed of two differential signaling pairs, with one differential pair for receiving data and the other for transmitting, and thus a lane enables simultaneous sending and receiving of data. A PCIe bus may support up to one peripheral device per lane. A root complex of a PCIe bus may receive data from a motherboard of a computer and transmit that data to one or more peripheral devices on the PCIe bus. A peripheral device of a PCIe bus may be referred to as an endpoint.

A PCIe analyzer may be used to probe the data flowing between a root complex and an endpoint (e.g., see FIG. 1) and is used to debug PCIe connections. Thus, a PCIe analyzer typically has two receivers per lane: one receiver to probe sending of data and another receiver to probe receiving of data. When a PCIe analyzer is being used to probe the data in a PCIe link of a device under test (DUT), if the DUT changes its receive line rate faster than the PCIe analyzer changes its receive line rate, then the PCIe analyzer may not be able to observe what occurs on the link during the line rate change. Observing the link during a line rate change is among the more important functions of a PCIe analyzer, as many problems can occur during a line rate change. Changing the receive line rate in previously known analyzers can take up to one millisecond, as the receivers (e.g., implemented by field programmable gate arrays (FPGAs)) in those analyzers are reconfigured and reset in order to change their receive line rate.

The present disclosure provides apparatus and techniques in which a receiver of a PCIe analyzer has its clock and data recovery (CDR) disabled (or externally controlled) when changing to a lower line rate (e.g., when changing from the highest line rate to any lower rate), and the phase of receiver sampling is effectively controlled (e.g., moved up or moved down) so that the receiver samples the input signal in the middle of eyes of the input signal and on transitions of the input signal. The samples from the middle of the eyes of the input signal are kept and reported on by the analyzer, while the samples from the transitions of the input signal are discarded. The phase of receiver sampling may be controlled by controlling the phase of a reference clock signal generated by an external reference clock generator with a phase shift control input, or by controlling the phase of a sampling clock signal internal to the receiver. A phase detector followed by a digital filter may implement a phase-locked loop (PLL) with the receiver (and in some cases the reference clock generator) to effectively control the phase of receiver sampling An advantage of the techniques described herein is that a PCIe analyzer may be able to change its line receive rate in a few nanoseconds, instead of taking ten microseconds or more to change line receive rates, as in previously known PCIe analyzers. The delay in changing line rates may only take a single clock cycle of the receiver to activate and/or deactivate logic therein.

Example Electrical Device with a Multi-Rate Reception Circuit

FIG. 1 shows a block diagram of a system 100, in which examples of the present disclosure may be practiced. The system 100 includes a PCIe analyzer 110, a root complex 102 of a PCIe bus, and an endpoint 120 of the PCIe bus. A probe 112 may be coupled at one end to a PCIe link and may be coupled at the other end to a receiver of the PCIe analyzer 110, which may receive a signal 130 (e.g., a high-speed digital signal) sent between the root complex 102 and the endpoint 120. The PCIe analyzer 110 then processes and analyzes samples of the signal 130. The root complex 102 and endpoint 120 may negotiate a line rate for communications between them. As described herein, when the line rate for the communications between the root complex 102 and endpoint 120 changes, it is desirable for the PCIe analyzer 110 to change the line receive rate of its receivers faster than the root complex 102 and endpoint 120 change the line rate of the communications therebetween.

Example Multi-Rate Reception Circuit Architecture

Figure 2A:
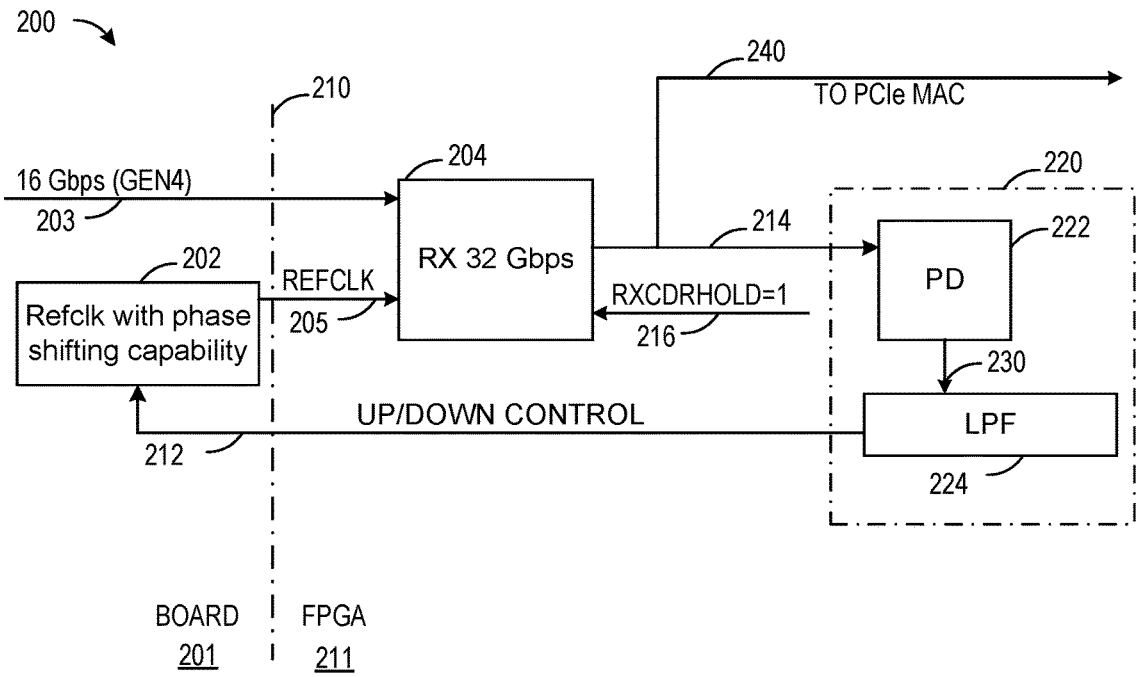
FIGS. 2A and 2B show block diagrams of circuits that implement multi-rate reception, in accordance with examples of the present disclosure.

FIG. 2A shows a block diagram of a circuit 200 for multi-rate reception, in accordance with examples of the present disclosure. As illustrated in FIG. 2A, the circuit 200 may be implemented with a board 201 (e.g., a motherboard of a computer) and an FPGA 211 disposed on and coupled to the board, with an interface 210 between the board 201 and the FPGA 211. The FPGA 211 may alternatively be implemented by another type of programmable logic device (PLD), an application specific integrated circuit (ASIC), discrete components, any of various other suitable circuits, or a combination thereof. Furthermore, for some examples, the circuit 200 may be implemented entirely on the board 201, with no interface 210 between the board 201 and some other device. For ease of description and understanding, however, the present disclosure will describe the circuit 200 as being separated into the FPGA 211 and the board 201.

The board 201 includes an input line 203 and a reference clock generator 202 that has phase-shifting capability based on a control input and is configured to generate a reference clock signal (REFCLK). REFCLK may have a clock speed sufficient to support sampling of the highest line rate supported by the receiver (e.g., 32 Gbps).

The FPGA 211 includes a receiver 204, a phase detector 222, and a digital low-pass filter 224, at least some of which may be implemented in the FPGA fabric (i.e., by programmable logic, such as configurable logic blocks (CLBs)). The phase detector 222 and low-pass filter 224 together may be part of a phase-locked loop (PLL) 220 for effectively controlling the sampling phase of the receiver 204.

In example operations, the board 201 sends data (e.g., from a probed PCIe link) along the input line 203 to the FPGA 211. In the FPGA 211, the receiver 204 may receive the data at a line receive rate of 32 gigabits/second (Gbps) (e.g., a rate for 5th generation (GEN5) PCIe buses) via the input line 203. The receiver 204 may use REFCLK as a local sampling clock signal, or may generate a local sampling clock signal based on REFCLK, for sampling the input data. The receiver 204 may use clock and data recovery (CDR) to generate and process samples to output to the PCIe medium access control (MAC) of the PCIe analyzer via line 240.

As illustrated, the input line 203 may change to a line rate of 16 Gbps (e.g., a rate for 4th generation (GEN4) PCIe buses) or a lower line rate (e.g., a rate of 8 Gbps, which is a rate for $3^{rd}$ generation (GEN3) PCIe buses). In response or based on instructions that the line rate will change, the PCIe analyzer sends a control signal 216 (labeled "RXCDRHOLD") to the receiver 204 to cause the receiver 204 to disable its CDR (e.g., assert RXCDRHOLD). Disabling the CDR of the receiver causes the CDR to be frozen in its last sampling phase.

Because the receiver is operating at 32 Gbps while the input signal on the line 203 is arriving at 16 Gbps, the receiver places two samples from the incoming data in each unit interval (UI), at a random position inside the UI. The phase detector 222 receives the samples 214 from the receiver 204 and detects the phase of the input signal received on the input line 203. The phase detector 222 compares the phase of the sampled data signal and the phase of the sampling clock signal (e.g., based on the time relationship between transitions of the data and clock signals) and sends a signal 230 to the low-pass filter 224 regarding the comparison, indicating whether to shift the phase of the sampling up or down or to keep the current phase of the sampling. The low-pass filter 224 receives the signal 230 and filters out the high-frequency transients to output a control signal 212 (labeled "UP/DOWN CONTROL").

In FIG. 2A, the UP/DOWN CONTROL signal 212 is sent to the control input of the reference clock generator 202. The reference clock generator 202 shifts (or maintains) the phase of REFCLK, which is output to the receiver 204. The receiver 204 continues sampling the input data signal received on the input line 203 according to the phase of REFCLK, which completes the phase-locked loop. Adjusting the phase of the reference clock signal effectively adjusts the phase of the local sampling clock signal used by the receiver 204 for sampling the input data signal, whether the reference clock signal is used directly by the receiver as the sampling clock signal or whether the sampling clock signal is derived from the reference clock signal.

By phase aligning the sampling clock signal (at the fastest line rate) with the input data signal (at a lower line rate), the signal integrity of the input data may be preserved, as opposed to sampling the input data at the wrong time, leading to incorrect decoding. In this manner, the input data signal may be sampled in the middle of the signal eye, and other data samples may be discarded. For an example where the input line rate is half the highest line rate, the PLL 220 may adjust the phase of REFCLK such that even transitions of the sampling clock signal occur in the middle of eyes of the sampled data and such that odd transitions of the sampling clock signal are aligned with transitions of the sampled data. In this case, the receiver 204 may be caused to keep each even-numbered sample and may discard each odd-numbered sample (see, e.g., FIG. 3B). In another example, the PLL 220 may adjust the phase of REFCLK such that odd transitions of the sampling clock signal occur in the middle of eyes of the sampled data and such that even transitions of the sampling clock signal are aligned with transitions of the sampled data. In this case, the receiver 204 may be caused to keep each odd-numbered sample and may discard each even-numbered sample.

In contrast with steering the phase of an external reference clock generator (and holding the CDR phase) to implement PLL functionality, an alternative design involves controlling the phase of the CDR internal to the receiver (e.g., the local sampling clock signal). In this design, a reference clock generator with phase-shifting capability is not needed.

Figure 2B:
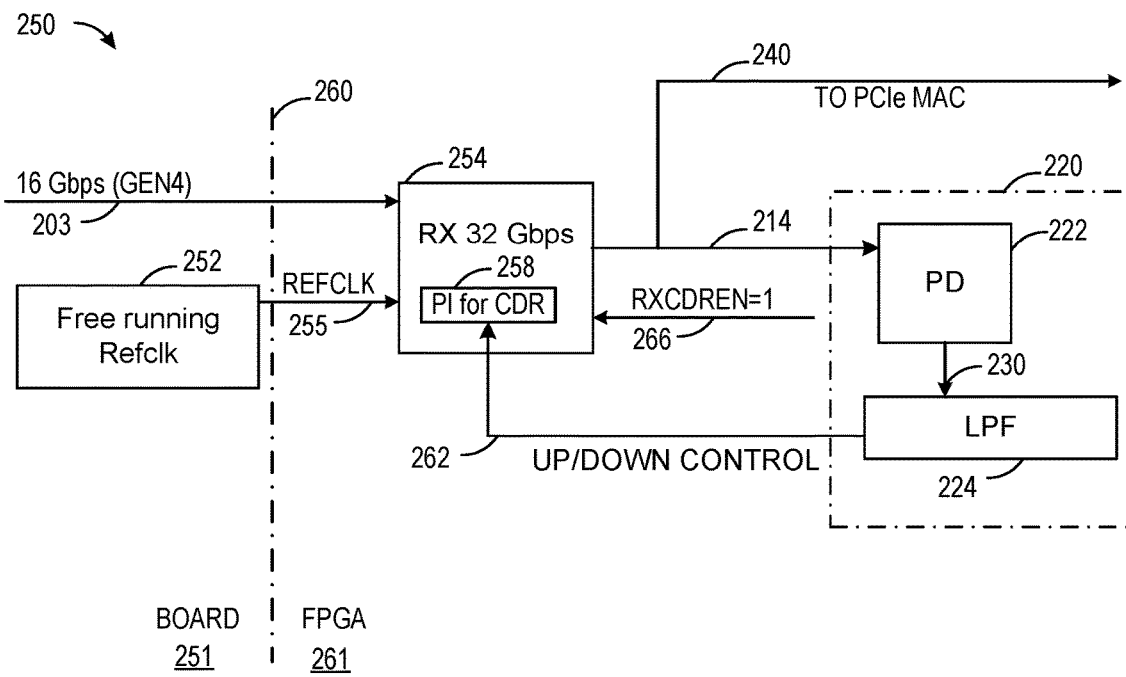

FIG. 2B shows a block diagram of such an alternative circuit 250 for multi-rate reception, in accordance with examples of the present disclosure. The circuit 250 includes a board 251 (e.g., a motherboard of a computer) and an FPGA 261, with an interface 260 between the board 251 and the FPGA 261. Similar to the description for FIG. 2A, the FPGA 261 of FIG. 2B may alternatively be implemented by another type of programmable logic device (PLD), an application specific integrated circuit (ASIC), discrete components, any of various other suitable circuits, or a combination thereof. Furthermore, for some examples, the circuit 250 may be implemented entirely on the board 251, with no interface 260 between the board 251 and some other device. For ease of description and understanding, however, the present disclosure will describe the circuit 250 as being separated into the FPGA 261 and the board 251.

The board 251 includes an input line 203 and a reference clock generator 252 configured to generate a reference clock signal (REFCLK). As described above, REFCLK may have a clock speed sufficient to support sampling of the highest line rate supported by the receiver (e.g., 32 Gbps). In this case, however, the reference clock generator 252 either does not have a control input for phase adjustment, or such a control input is not used, such that the reference clock signal is free running.

The FPGA 261 includes a receiver 254, the phase detector 222, and the low-pass filter 224, at least some of which may be implemented in the FPGA fabric (i.e., by programmable logic, such as by configurable logic blocks (CLBs)).

In example operations, after the input line 203 changes from the highest line rate to a lower line rate (e.g., from 32 to 16 Gbps), the PCIe analyzer sends a control signal 266 (labeled "RXCDREN") to the receiver 254 to cause the receiver 254 to enable direct control of the phase of its CDR (e.g., by deactivating an internal phase interpolator (PI) 258 of the receiver for normal CDR). Because the receiver is operating at 32 Gbps while the input signal on the line 203 is arriving at 16 Gbps, the receiver places two samples from the incoming data in each UI, at a random position within the UI. Similar to operations described above, the phase detector 222 receives the samples 214 from the receiver 254 and detects the phase of the input signal received on the input line 203. The phase detector 222 compares the phase of the sampled data signal and the phase of the sampling clock signal (e.g., based on the time relationship between transitions of the data and clock signals) and sends a signal 230 to the low-pass filter 224 regarding the comparison, indicating whether to shift the phase of the sampling up or down or to keep the current phase of the sampling. The low-pass filter 224 receives the signal 230 and filters out the high-frequency transients to output a control signal 262 (labeled "UP/DOWN CONTROL").

In FIG. 2B, the UP/DOWN CONTROL signal 262 is sent to a control input of the receiver 254, such as a control input of the PI 258 for CDR in the receiver. The receiver 254 shifts (or maintains) the phase of its local sampling clock signal for CDR in response to the UP/DOWN CONTROL signal 262. In other words, rather than performing normal CDR and adjusting the phase of the local sampling clock signal (as may be done for the highest line rate) based on the input data signal, the phase of the local sampling clock signal is adjusted "manually" at the PI 258 according to the UP/DOWN CONTROL signal 262. The receiver 254 continues sampling the input data signal received on the input line 203 according to the phase of the local sampling clock signal for CDR, which completes the PLL. The remainder of the circuit 250 of FIG. 2B may be connected and operate similarly to the circuit 200 described with respect to FIG. 2A.

Example Phase Detector Implementation

Figure 3A:
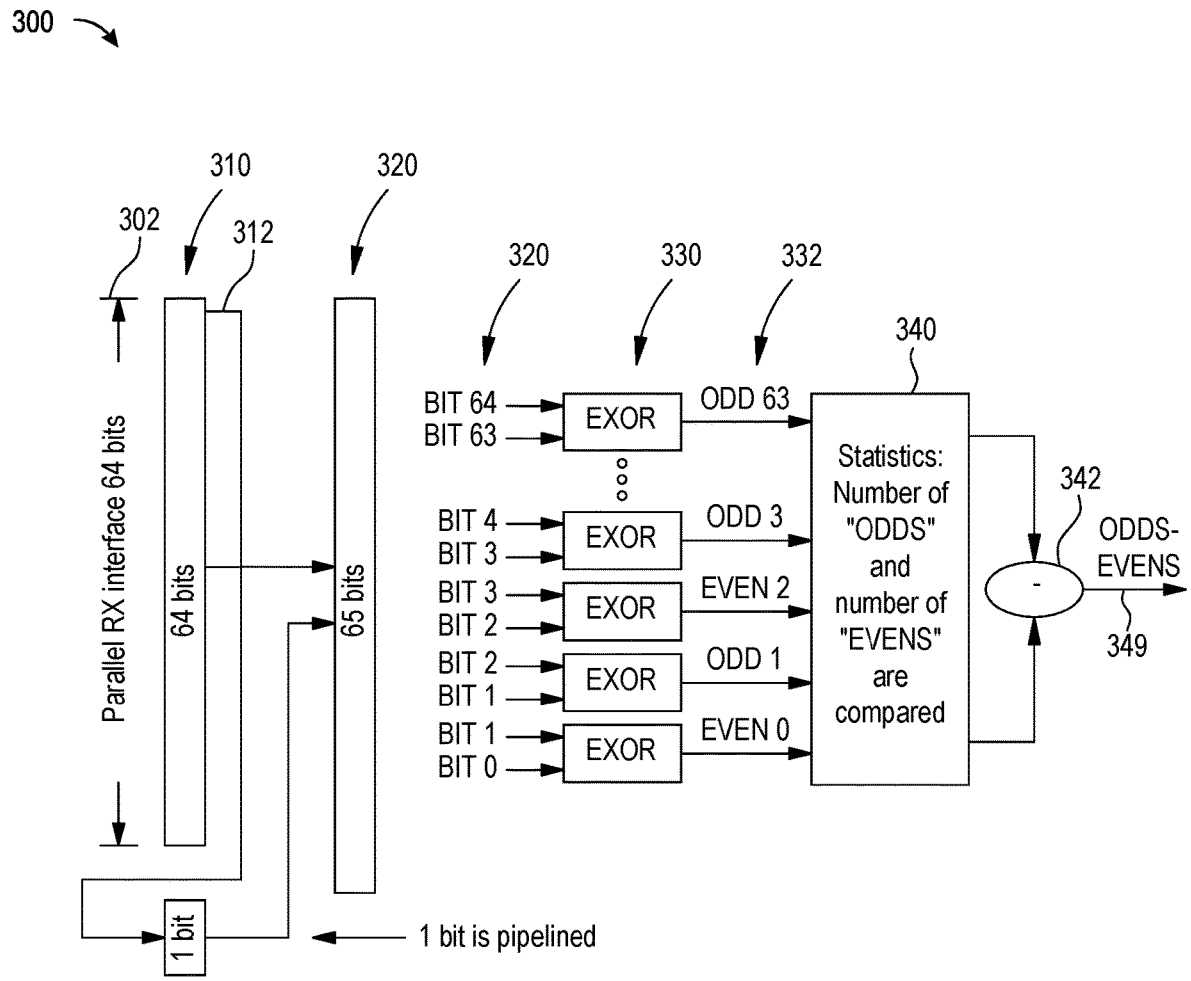
FIGS. 3A and 3B show a block diagram of an example implementation of a phase detector and an example desired alignment in time of the sampling clock signal with the input data at a lower line rate, in accordance with examples of the present disclosure.

FIG. 3A shows a block diagram of an example implementation of a phase detector 300 (e.g., for the phase detector 222, shown in FIGS. 2A and 2B), in accordance with examples of the present disclosure. The phase detector 300 is detecting phase of a signal received via a parallel interface 302 (e.g., a 64-bit wide parallel receive interface, as shown). The parallel interface 302 may represent the oversampled data output by the receiver, which is a sampled version of the input data signal received on the input line 203, sampled with a higher frequency sampling clock signal (e.g., oversampled by 2×, 4×, or some other factor). The interface 302 delivers a first set 310 of n bits (e.g., n=64). The phase detector takes one bit 312 (e.g., the last bit from the first set 310) and combines this bit with the next set of n bits to form a set 320 of n+1 bits (e.g., 65 bits). The phase detector 300 then, using a logical exclusive OR (XOR) bank 330 of XOR gates, performs a binary XOR operation on each pair of consecutive bits in the set 320 of 65 bits. Each XOR gate in the logical XOR bank 330 is classified as an even XOR gate or an odd XOR gate based on a position of the respective XOR gate in the logical XOR bank. For example, as depicted in FIG. 3A, the even XOR gates are labeled "EVEN 0," "EVEN 2," ... "EVEN 62," and the odd XOR gates are labeled "ODD 1," "ODD 3," ... "ODD 63," for 64 total XOR gates for a 65-bit set. Each of the XOR gates outputs either a logical 0 or 1 at outputs 332. When each of the pair of consecutive bits has the same value, the XOR outputs a 0, indicating that there is no transition in value between that pair of consecutive bits. When each of the pair of consecutive bits has different values, the XOR outputs a 1, indicating that there is a transition in value between that pair of consecutive bits.

Logic 340 is used to determine the number of transitions from the even XOR gates and the number of transitions from the odd XOR gates, and logic 342 is used to determine between these two numbers of transitions. For example and as shown in FIG. 3A, logic 342 may subtract the number of transitions from the even XOR gates from the number of transitions from the odd XOR gates. The result 349 of the comparison indicates whether the sampling phase of the receiver (e.g., the local sampling clock signal) is ahead of the phase of the signal from the parallel interface 302 (e.g., the oversampled data), behind the phase of the signal from the parallel interface 302, or in-phase with the signal from the parallel interface 302. The result 349 of the comparison may be supplied to a filter (e.g., the low-pass filter 224, shown in FIGS. 2A and 2B), which may output an UP/DOWN CONTROL signal to adjust the phase of a reference clock signal for the receiver or the phase of a clock signal for CDR in the receiver.

Figure 3B:
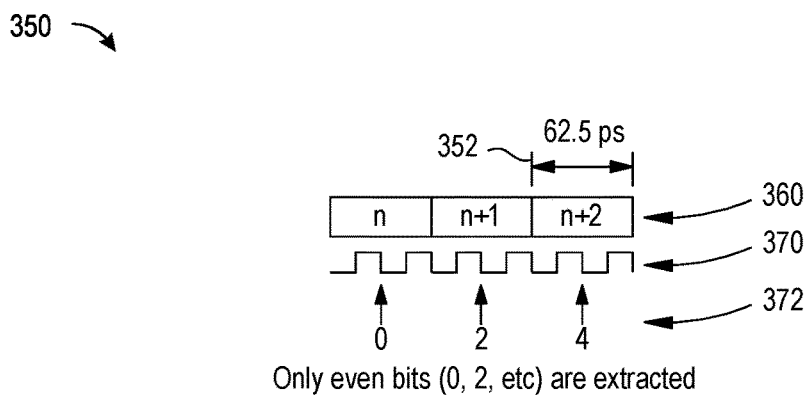

FIG. 3B shows a timing diagram 350 of an example desired alignment in time of the sampling clock signal 370 with the input data signal 360 at a lower line rate, in accordance with examples of the present disclosure. The input data signal 360 illustrates three bits labeled n, n+1, and n+2. For an example input signal at a line rate of 16 Gbps, each bit has an interval 352 of 62.5 picoseconds (ps). The sampling clock signal 370 (e.g., at twice the frequency) may be used to sample the input data at falling edges of the clock signal or on rising edges of the clock signal.

Indices of the samples are shown at 372, which were taken on the falling edge of the sampling clock signal 370 in this example. In the example timing diagram 350, the sampling clock signal 370 is in-phase with the input data signal 360, with even-numbered samples (e.g., 0, 2, 4) being taken near the middle of the eye of each bit in the input data signal, and with odd-numbered samples (e.g., 1, 3, 5) being taken near the transitions between each bit in the input data signal.

As previously described herein, the example implementation of the phase detector 300 in FIG. 3A may force the transitions between bits of the input data signal to occur on the odd samples (e.g., on the falling edges of odd clock cycles in the sampling clock signal). In this manner, and as shown in FIG. 3B, the even-numbered samples are aligned with the middles of the eyes of the input data signal 360, and the odd-numbered samples are aligned with the transitions in the input data signal. Thus, the PCIe analyzer receiving the samples from the receiver may discard the odd-numbered samples and analyze and report on the even-numbered samples.

The above approach in FIGS. 3A and 3B assumes that the lower line rate is half of the highest line rate (e.g., switching to a 16 Gbps line rate on a receiver that supports 32 Gbps). However, similar approaches may be used when switching to line rates that are even lower than half of the highest line rate (e.g., switching to a line rate of 8 Gbps for GEN3 PCIe busses). For example, when the highest line rate supported by the receiver is a multiple of the input line rate by a factor number, the PLL may control the phase of the sampling such that one of every factor number of sampling clock cycles transitions in the middle of an eye of the input data signal. For example, if the line rate is switched to 8 Gbps for a 32 Gbps receiver, then the phase of the sampling may be adjusted so that one of every four sampling clock cycles transitions in the middle of the eye of the input data signal.

Example Digital Low-Pass Filter Implementation

Figure 4:
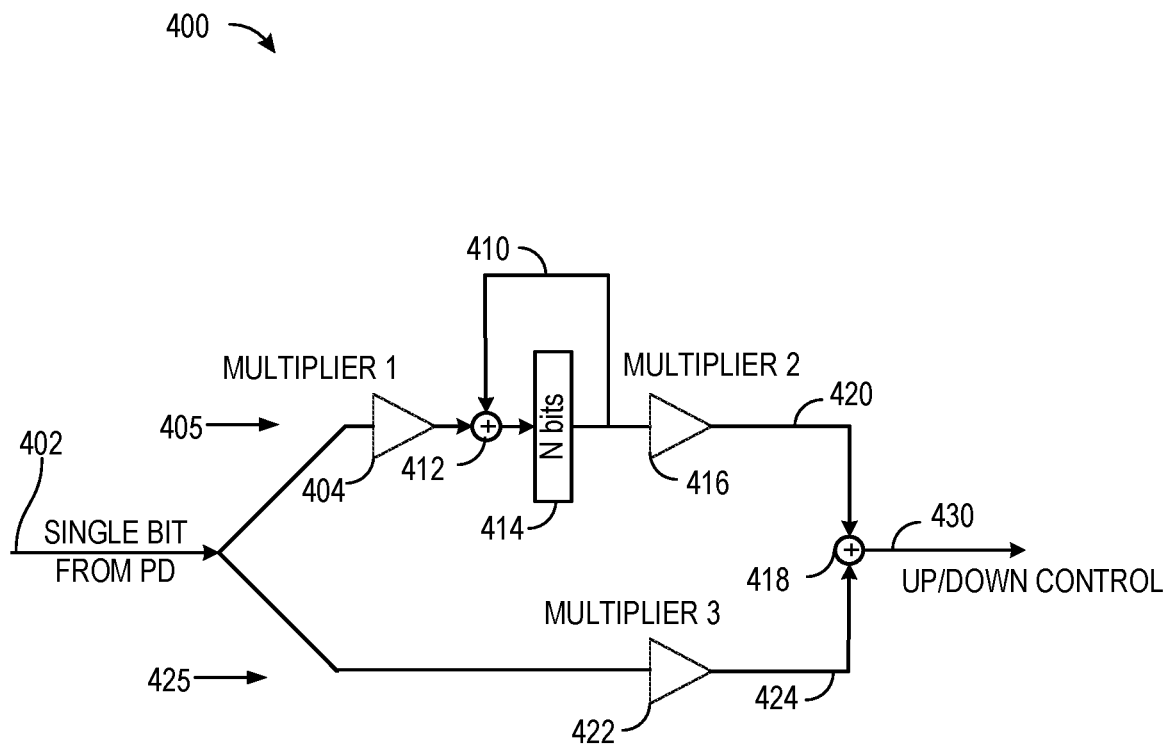
FIG. 4 shows a block diagram of an example low-pass filter, in accordance with an example of the present disclosure.

FIG. 4 shows a block diagram of an example low-pass filter 400, in accordance with an example of the present disclosure. The filter 400 may be an example implementation of the low-pass filter 224, shown in FIGS. 2A and 2B, although any of various other suitable filter designs may be implemented. As illustrated in FIG. 4, the filter 400 may function as a proportional/integral (PI) filter. The filter 400 may include a first multiplier 404, a second multiplier 416, a third multiplier 422, a first combiner 412, a register 414, and a second combiner 418. In the filter 400, all arithmetic operations (e.g., additions and multiplications) may be performed as two's-complement operations.

At an input 402, a single bit (e.g., provided by a phase detector, such as the phase detector 222) may be received. The single bit may indicate whether the sampling clock signal should be shifted up in time, down in time, or kept with the same phase. The single bit is provided via a first branch 405 (e.g., the integral branch) to the first multiplier 404 (labeled "Multiplier 1"), which may multiply the bit by a first coefficient supplied (e.g., from a memory of the PCIe analyzer including the filter) to the filter 400. The output from the first multiplier 404 may be combined with (e.g., added to) a bit from an output 410 of the register 414 at the first combiner 412, and the effectively integrated result may be output to the register 414, which may store N bits. The output of the register 414 may also be multiplied with a second coefficient by the second multiplier 416 (labeled "Multiplier 2"). A frequency offset between incoming data and the sampling clock signal of the receiver may be read at the output 420 of the second multiplier 416.

The same bit received at the input 402 is provided via a second branch 425 (e.g., the proportional branch) to the third multiplier 422 (labeled "Multiplier 3"), which may multiply the bit by a third coefficient. The output 420 of the second multiplier 416 and the output 424 of the third multiplier 422 may be combined (e.g., added) by the second combiner 418 to generate an UP/DOWN CONTROL signal at the output 430 of the filter 400, which may be sent to a reference clock generator or to a receiver (e.g., to adjust a phase of a clock signal). The first coefficient, second coefficient, and third coefficient may be supplied to the filter 400 from a memory of a PCIe analyzer that includes the filter 400.

Example Multi-Rate Reception Operations

Figure 5:
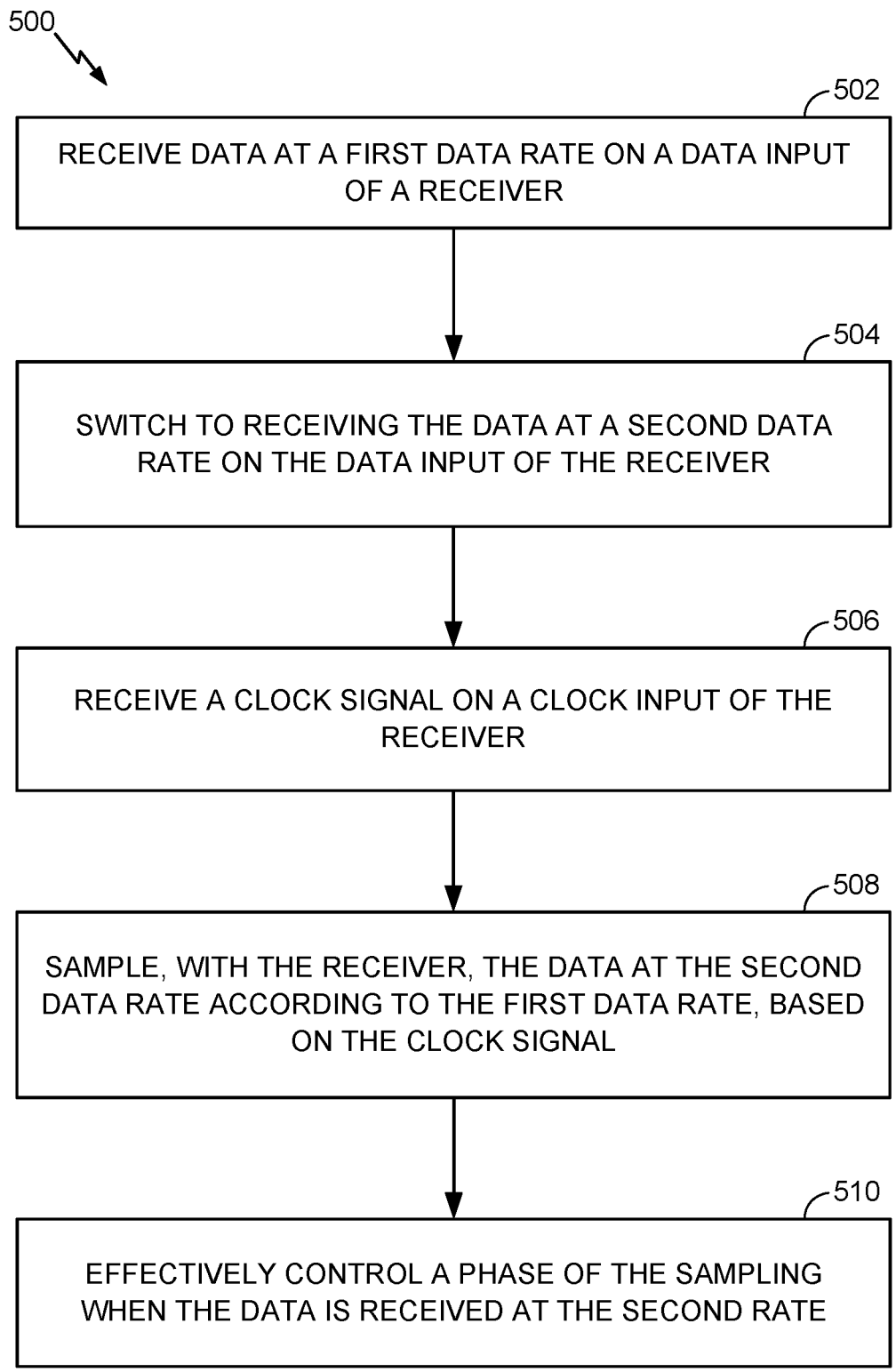
FIG. 5 depicts a flow diagram of example operations for multi-rate reception, in accordance with an example of the present disclosure.

FIG. 5 depicts a flow diagram of example operations 500 for multi-rate reception. The operations 500 may be performed by a PCIe analyzer, or more particularly by a receiver and associated circuitry in a PCIe analyzer, such as the PCIe analyzer 110 and circuits 200 and 250 of FIGS. 1, 2A, and 2B, respectively. The flow diagram includes blocks representing the operations 500.

The operations 500 may begin, at block 502, by receiving data at a first data rate on a data input of a receiver. In some examples, this corresponds to receiving data of the signal 130 at a first data rate (e.g., 32 Gbps) in a receiver of the PCIe analyzer 110, shown in FIG. 1. In other examples, this corresponds to receiving data at a first data rate (e.g., 32 Gbps) on an input line 203 of receiver 204 or of receiver 254, shown in FIGS. 2A and 2B.

The operations 500 continue, at block 504, by switching to receiving the data at a second data rate on the data input of the receiver. In some examples, this corresponds to switching to receiving the data of the signal 130 at a second data rate (e.g., 16 Gbps, 8 Gbps, or 4 Gbps) on the data input of the receiver in the PCIe analyzer 110, shown in FIG. 1. In other examples, this corresponds to switching to receiving the data at a second data rate (e.g., 16 Gbps) on the input line 203 of receiver 204 or of receiver 254, shown in FIGS. 2A and 2B.

The operations 500 proceed, at block 506, by receiving a clock signal on a clock input of the receiver. In some examples, this corresponds to receiving a clock signal on a clock input of the receiver in the PCIe analyzer 110, shown in FIG. 1. In other examples, this corresponds to receiving the clock signal REFCLK on the clock input 205 of the receiver 204, shown in FIG. 2A. In yet other examples, this corresponds to receiving the clock signal REFCLK on a clock input 255 of the receiver 254, shown in FIG. 2B.

The operations 500 continue, at block 508, by sampling, with the receiver, the data at the second data rate according to the first data rate, based on the clock signal. In some examples, this corresponds to sampling, with the receiver of the PCIe analyzer 110, the data of the signal 130 at the second data rate according to the first data rate, based on the clock signal, as shown in FIG. 1. In other examples, this corresponds to sampling, with the receiver 204, the data on the input line 203 at the second data rate (e.g., 16 Gbps) according to the first data rate (e.g., 32 Gbps), based on the clock signal REFCLK. In yet other examples, this corresponds to sampling, with the receiver 254, the data on the input line 203 at the second data rate (e.g., 16 Gbps) according to the first data rate (e.g., 32 Gbps), based on the clock signal REFCLK.

The operations 500 proceed, at block 510, by effectively controlling a phase of the sampling when the data is received at the second rate. In some examples, this corresponds to effectively controlling a phase of the sampling of the data of the signal 130 when the data is received at the second rate. In other examples, this corresponds to changing the phase of the reference clock generator 202 in response to an UP/DOWN CONTROL signal 212 in order to control the phase of the sampling of the data on the input line 203 by the receiver 204, as shown in FIG. 2A. In yet other examples, this corresponds to changing the phase of the CDR in the receiver 254, in response to an UP/DOWN CONTROL signal 262 received by the PI 258 for CDR of the receiver 254, in order to control the phase of the sampling of the data on the input line 203 by the receiver 254, as shown in FIG. 2B.

According to some examples, the effectively controlling of block 510 involves controlling a clock generator (e.g., the reference clock generator 202, shown in FIG. 2A) to adjust a phase of the clock signal (e.g., REFCLK). In this case, the sampling of block 508 may include sampling the data at the second data rate (e.g., 16 Gbps), according to the first data rate (e.g., sampling with a sampling clock signal at 32 Gbps), using the phase-adjusted clock signal. For some example, the operations 500 further include enabling clock and data recovery (CDR) for the receiver when the data is at the first data rate and disabling the CDR for the receiver when the data is at the second data rate (e.g., by controlling RXCDRHOLD).

According to some examples, the receiver comprises a phase interpolator for clock and data recovery (e.g., the PI 258 for CDR). In this case, the operations 500 may further include enabling the phase interpolator to control a phase for the clock and data recovery (CDR) when the data is at the first data rate (e.g., by asserting RXCDREN). For some examples, the effectively controlling of block 510 involves disabling the phase interpolator when the data is at the second data rate and controlling the phase for the clock and data recovery (CDR) internal to the receiver (e.g., by deasserting RXCDREN).

According to some examples, the first data rate is a multiple of the second data rate by a factor number (e.g., 2, 4, etc.), the effectively controlling of block 510 includes effectively controlling the phase of the sampling such that one of every factor number of multiple clock cycles of a sampling clock signal at the first data rate (e.g., one of every 2 or every 4 clock cycles of the sampling clock signal) transitions in a middle of an eye of an input data signal for the data at the second data rate. In this case, the operations 500 may further include outputting one of every factor number of samples of the data on a data output of the receiver. In some such cases, the factor number is two, and the effectively controlling of block 510 involves controlling the phase of the sampling such that even clock cycles of the sampling clock signal transition (i.e., change from logic high to low for falling edges or vice versa for rising edges) in middles of eyes of the input data signal and such that odd clock cycles of the sampling clock signal transition at transition positions of the input data signal (e.g., as shown in FIG. 3B). In some cases, the effectively controlling of block 510 includes: comparing, with a logical XOR bank (e.g., XOR bank 330), adjacent bits from a parallel interface, wherein each XOR gate in the logical XOR bank is classified as an even XOR gate or an odd XOR gate based on a position of the respective XOR gate in the logical XOR bank; comparing, with logic (e.g., logic 340 and 342), a number of transitions from the even XOR gates to a number of transitions from the odd XOR gates; effectively shifting the phase of the sampling by the receiver if the number of transitions from the even XOR gates differs from the number of transitions from the odd XOR gates; and maintaining the phase of the sampling by the receiver if the number of transitions from the even XOR gates equals the number of transitions from the odd XOR gates.

Example Programmable Integrated Circuits

The multi-rate reception circuits described herein may be implemented for the receiver of an electrical device, such as a PCIe analyzer. A multi-rate reception circuit (e.g., the multi-rate reception circuits 200 or 250) may be included in any of various suitable devices or systems, such as an integrated circuit (IC) or module.

One type of IC that may implement a multi-rate reception circuit (e.g., the multi-rate reception circuit 200 or 250) is a programmable IC, such as a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. Other programmable ICs known as "mask programmable devices" are programmed by applying a processing layer, such as a metal layer, that selectively interconnects the various elements on the device according to the programmable mask. The phrase "programmable IC" can also encompass devices that are only partially programmable, such as application-specific integrated circuits (ASICs).

Figure 6:
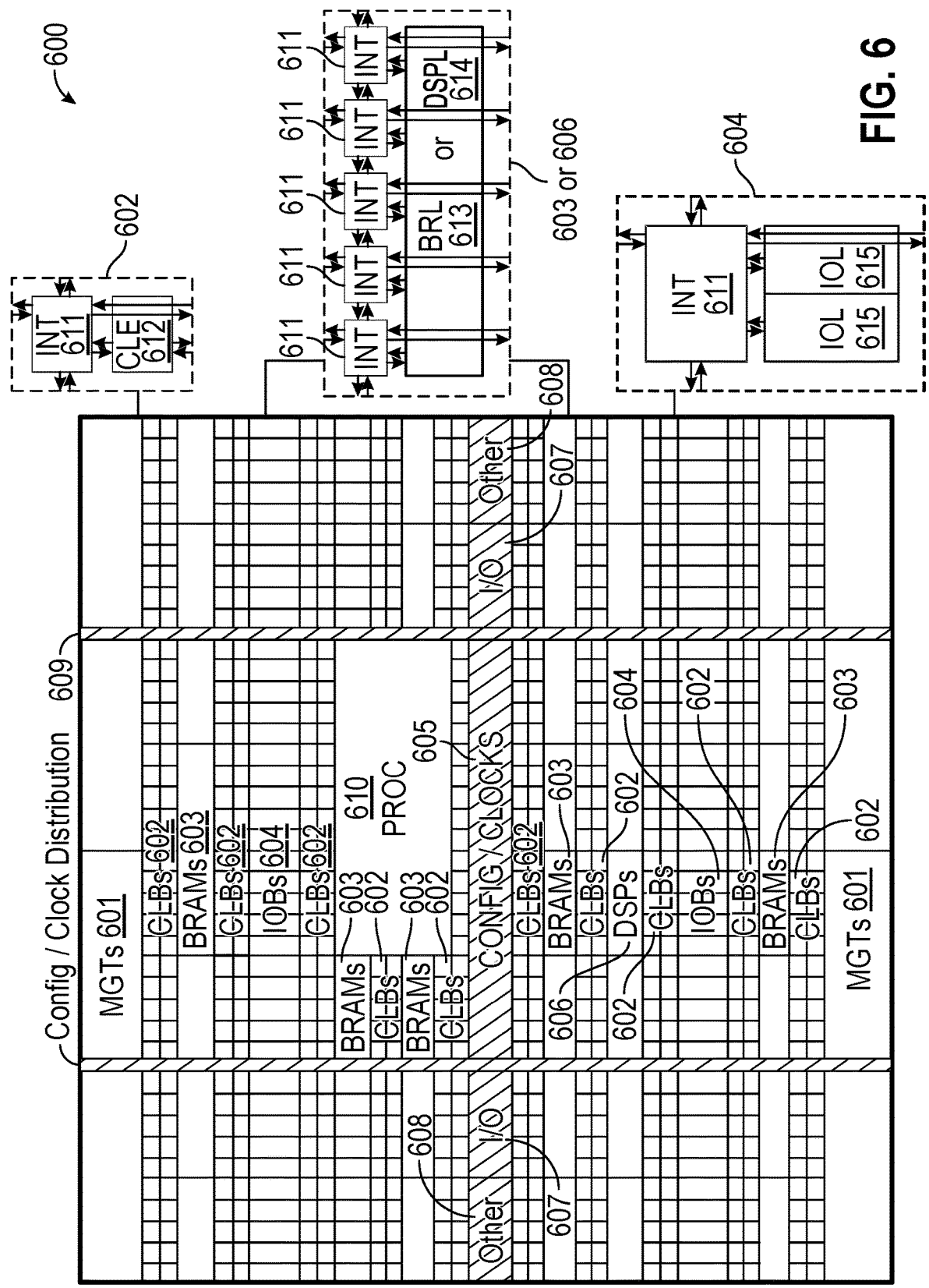
FIG. 6 is a block diagram illustrating an example architecture for a programmable device, in which aspects of the present disclosure may be practiced.

FIG. 6 is a block diagram illustrating an example architecture 600 for a programmable device. The architecture 600 may be implemented within a field programmable gate array (FPGA), for example. As shown, the architecture 600 includes several different types of programmable circuitry (e.g., logic blocks). For example, the architecture 600 may include a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized I/O blocks 607 (e.g., configuration ports and clock ports), and other programmable logic 608, such as digital clock managers, analog-to-digital converters (ADCs), system monitoring logic, and the like.

In some FPGAs, each programmable tile includes a programmable interconnect element (INT) 611 having standardized connections to and from a corresponding INT 611 in each adjacent tile. Therefore, the INTs 611, taken together, implement the programmable interconnect structure for the illustrated FPGA. Each INT 611 also includes the connections to and from the programmable logic element within the same tile, as shown by the examples included at the far right of FIG. 6.

For example, a CLB 602 may include a configurable logic element (CLE) 612 that can be programmed to implement user logic plus a single INT 611. A BRAM 603 may include a BRAM logic element (BRL) 613 in addition to one or more INTs 611. Typically, the number of INTs 611 included in a tile depends on the width of the tile. In the pictured example, a BRAM tile has the same width as five CLBs, but other numbers (e.g., four) can also be used. A DSP block 606 may include a DSP logic element (DSPL) 614 in addition to an appropriate number of INTs 611. An 10B 604 may include, for example, two instances of an I/O logic element (IOL) 615 in addition to one instance of an INT 611. As will be clear to a person having ordinary skill in the art, the actual I/O pads connected, for example, to the IOL 615 typically are not confined to the area of the IOL 615.

In the example architecture 600 depicted in FIG. 6, a horizontal area near the center of the die (shown shaded in FIG. 6) is used for configuration, clock, and other control logic (CONFIG/CLOCKS 605). Other vertical areas 609 extending from this central area may be used to distribute the clocks and configuration signals across the breadth of the FPGA.

Some FPGAs utilizing the architecture 600 illustrated in FIG. 6 include additional logic blocks that disrupt the regular row structure making up a large part of the FPGA. The additional logic blocks may be programmable blocks and/or dedicated circuitry. For example, a processor block depicted as PROC 610 spans several rows of CLBs 602 and BRAMs 603.

The PROC 610 may be implemented as a hard-wired processor that is fabricated as part of the die that implements the programmable circuitry of the FPGA. The PROC 610 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 610 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein), as well as to the interconnect circuitry that selectively couples the various circuit blocks, tiles, and/or elements according to configuration data that is loaded into the FPGA. For example, portions shown in FIG. 6 that are external to the PROC 610 may be considered part of the, or the, programmable circuitry of the FPGA.

FIG. 6 is intended to illustrate an example architecture 600 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 6 are exemplary. In an actual FPGA, for example, more than one adjacent row of CLBs 602 is typically included wherever the CLBs appear, in an effort to facilitate the efficient implementation of a user circuit design. The number of adjacent CLB rows, however, can vary with the overall size of the FPGA. Further, the size and/or positioning of the PROC 610 within the FPGA is for purposes of illustration only and is not intended as a limitation of the one or more examples of the present disclosure.

Additional Considerations

In the preceding, reference is made to examples presented in this disclosure. However, the scope of the present disclosure is not limited to specific described examples. Instead, any combination of the described features and elements, whether related to different examples or not, is contemplated to implement and practice contemplated examples. Furthermore, although examples disclosed herein may achieve advantages over other possible solutions or over the prior art, whether or not a particular advantage is achieved by a given example is not limiting of the scope of the present disclosure. Thus, the preceding aspects, features, embodiments, and advantages are merely illustrative and are not considered elements or limitations of the attached claims except where explicitly recited in one or more of the claims.

As will be appreciated by one skilled in the art, the examples disclosed herein may be embodied as a system, method, or apparatus, and the like. Accordingly, examples may take the form of an entirely hardware embodiment or a combination of hardware products or an embodiment combining hardware aspects with corresponding programming that may all generally be referred to herein as a "circuitry" or "system." Furthermore, certain aspects, such as programmable logic blocks, lookup tables (LUTs), and the like, may take the form of hardware components that can be controlled using corresponding programming.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination of the foregoing. In the context of this document, a computer-readable storage medium is any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electrical, magnetic, optical, electromagnetic, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless (e.g., radio frequency (RF) or infrared), wireline, optical fiber or cable, etc., or any suitable combination of the foregoing.

Computer program code for carrying out operations or programming for examples of the present disclosure may be written in any combination of one or more programming languages, including an object oriented programming language such as Java, Smalltalk, C++ or the like and procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Examples of the present disclosure are described herein with reference to flowchart illustrations and/or block diagrams of methods, apparatus (e.g., systems), and computer program products presented herein. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

For example, means for receiving data and/or means for switching to receive data may include a receiver, such as the receiver 204 or 254 illustrated in FIG. 2A or 2B, and more particularly, a data input of such a receiver. Means for receiving a clock signal may include a receiver, such as the receiver 204 or 254 depicted in FIG. 2A or 2B, and more particularly, a clock input of such a receiver. Means for sampling may include a data sampler in the receiver. Means for effectively controlling a phase of the sampling may include a phase-locked loop (e.g., PLL 220 in FIGS. 2A and 2B), which in some cases may include a reference clock generator (e.g., reference clock generator 202 as shown in FIG. 2A).

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer-implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and apparatus according to various examples of the present disclosure. In this regard, each block in the flowchart or block diagrams may represent circuitry, programming for such circuitry, or portion of instructions for such circuitry, which comprises one or more executable instructions for controlling or programming the circuitry to perform the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

The invention claimed is:

1. A circuit for multi-rate reception, comprising:
a receiver having a data input, a data output, and a clock input configured to receive a clock signal from a clock generator, the receiver being configured to switch between receiving data at a first data rate and at least one second data rate and to sample data according to the first data rate, wherein the first data rate is higher than the at least one second data rate;
a phase detector having an input coupled to the data output of the receiver; and
a filter having an input coupled to an output of the phase detector and having an output configured to effectively control a phase of the sampling by the receiver when the data is at the at least one second data rate.

2. The circuit of claim 1, wherein the clock generator comprises a control input to adjust a phase of the clock signal and wherein the output of the filter is coupled to the control input of the clock generator.

3. The circuit of claim 2, wherein the receiver further comprises a control input configured to enable clock and data recovery for the receiver when the data is at the first data rate and to disable the clock and data recovery for the receiver when the data is at the at least one second data rate.

4. The circuit of claim 1, wherein the receiver further comprises a first control input to adjust a phase for clock and data recovery internal to the receiver and wherein the output of the filter is coupled to the first control input of the receiver.

5. The circuit of claim 4, wherein the receiver further comprises:
a phase interpolator for the clock and data recovery; and
a second control input configured to enable the phase interpolator to control the phase for the clock and data recovery when the data is at the first data rate and to disable the phase interpolator when the data is at the at least one second data rate such that a control signal from the filter is configured to control the phase for the clock and data recovery internal to the receiver.

6. The circuit of claim 1, wherein:
the first data rate is a multiple of the second data rate by a factor number;
the receiver, the phase detector, and the filter compose a phase-locked loop configured to control the phase of the sampling such that one of every factor number of multiple clock cycles of a sampling clock signal at the first data rate transitions in a middle of an eye of an input data signal for the data at the second data rate; and
the receiver is configured to output one of every factor number of samples of the data on the data output of the receiver.

7. The circuit of claim 6, wherein the factor number is two and wherein the phase-locked loop is configured to control the phase of the sampling such that even clock cycles of the sampling clock signal transition in middles of eyes of the input data signal and such that odd clock cycles of the sampling clock signal transition at transition positions of the input data signal.

8. The circuit of claim 7, wherein the phase detector comprises:
a logical XOR bank having inputs coupled to the data output of the receiver and configured to compare adjacent bits, wherein each XOR gate in the logical XOR bank is classified as an even XOR gate or an odd XOR gate based on a position of the respective XOR gate in the logical XOR bank; and
logic having inputs coupled to outputs from the logical XOR bank and configured to compare a number of transitions from the even XOR gates to a number of transitions from the odd XOR gates.

9. The circuit of claim 8, wherein the phase-locked loop is configured to control the phase of the sampling by:
effectively shifting the phase of the sampling by the receiver if the number of transitions from the even XOR gates differs from the number of transitions from the odd XOR gates; and maintaining the phase of the sampling by the receiver if the number of transitions from the even XOR gates equals the number of transitions from the odd XOR gates.

10. The circuit of claim 1, wherein the receiver, the phase detector, and the filter are implemented by programmable logic and wherein the receiver is configured to switch between receiving data at the first data rate and the at least one second data rate within one clock cycle of the clock signal.

11. The circuit of claim 1, wherein the first data rate is 32 gigabits per second (Gbps) and wherein the at least one second data rate includes a 16 Gbps data rate.

12. A Peripheral Component Interconnect Express (PCIe) analyzer comprising:
a clock generator;
a receiver having a data input, a data output, and a clock input coupled to an output of the clock generator and configured to receive a clock signal from the clock generator, the receiver being configured to switch between receiving data at a first data rate and at least one second data rate and to sample data according to the first data rate, wherein the first data rate is higher than the at least one second data rate;
a phase detector having an input coupled to the data output of the receiver; and
a filter having an input coupled to an output of the phase detector and having an output configured to effectively control a phase of the sampling by the receiver when the data is at the at least one second data rate.

13. The PCIe analyzer of claim 12, wherein the clock generator has a control input coupled to the output of the filter.

14. The PCIe analyzer of claim 13, wherein:
the control input of the clock generator is configured to adjust a phase of the clock signal; and
the receiver further comprises a control input configured to enable clock and data recovery for the receiver when the data is at the first data rate and to disable the clock and data recovery for the receiver when the data is at the at least one second data rate.

15. A method of multi-rate reception, comprising:
receiving data at a first data rate on a data input of a receiver;
switching to receiving the data at a second data rate on the data input of the receiver;
receiving a clock signal on a clock input of the receiver;
sampling, with the receiver, the data at the second data rate according to the first data rate, based on the clock signal; and
effectively controlling a phase of the sampling when the data is received at the second rate.

16. The method of claim 15, wherein the effectively controlling comprises controlling a clock generator to adjust a phase of the clock signal, wherein the sampling comprises sampling the data at the second data rate, according to the first data rate, using the phase-adjusted clock signal, and wherein the method further comprises:
enabling clock and data recovery for the receiver when the data is at the first data rate; and
disabling the clock and data recovery for the receiver when the data is at the second data rate.

17. The method of claim 15, wherein the receiver comprises a phase interpolator for clock and data recovery, wherein the method further comprises enabling the phase interpolator to control a phase for the clock and data recovery when the data is at the first data rate, and wherein the effectively controlling comprises:
disabling the phase interpolator when the data is at the second data rate; and
controlling the phase for the clock and data recovery internal to the receiver.

18. The method of claim 15, wherein:
the first data rate is a multiple of the second data rate by a factor number;
the effectively controlling comprises effectively controlling the phase of the sampling such that one of every factor number of multiple clock cycles of a sampling clock signal at the first data rate transitions in a middle of an eye of an input data signal for the data at the second data rate; and
the method further comprises outputting one of every factor number of samples of the data on a data output of the receiver.

19. The method of claim 18, wherein the factor number is two and wherein the effectively controlling comprises controlling the phase of the sampling such that even clock cycles of the sampling clock signal transition in middles of eyes of the input data signal and such that odd clock cycles of the sampling clock signal transition at transition positions of the input data signal.

20. The method of claim 18, wherein the effectively controlling comprises:
comparing, with a logical XOR bank, adjacent bits from a parallel interface, wherein each XOR gate in the logical XOR bank is classified as an even XOR gate or an odd XOR gate based on a position of the respective XOR gate in the logical XOR bank;
comparing, with logic, a number of transitions from the even XOR gates to a number of transitions from the odd XOR gates;
effectively shifting the phase of the sampling by the receiver if the number of transitions from the even XOR gates differs from the number of transitions from the odd XOR gates; and
maintaining the phase of the sampling by the receiver if the number of transitions from the even XOR gates equals the number of transitions from the odd XOR gates.

* * * * *